(12) United States Patent
Mei et al.

(10) Patent No.: US 7,829,356 B2
(45) Date of Patent: Nov. 9, 2010

(54) THIN FILM SCRIBE PROCESS

(75) Inventors: Fang Mei, Foster City, CA (US); David Tanner, San Jose, CA (US); Tzay-Fa Su, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/212,535

(22) Filed: Sep. 17, 2008

(65) Prior Publication Data

US 2010/0068835 A1 Mar. 18, 2010

(51) Int. Cl.
*G01R 31/26* (2006.01)

(52) U.S. Cl. .............................. 438/17; 438/57; 438/86

(58) Field of Classification Search ........................ None
See application file for complete search history.

(56) References Cited

U.S. PATENT DOCUMENTS

| | | |
|---|---|---|
| 4,628,144 A | 12/1986 | Burger |
| 6,468,828 B1 | 10/2002 | Glatfelter et al. |
| 7,019,207 B2 | 3/2006 | Harneit et al. |
| 7,259,321 B2 | 8/2007 | Oswald et al. |
| 2001/0037823 A1 | 11/2001 | Middelman et al. |
| 2003/0180983 A1* | 9/2003 | Oswald et al. ................ 438/57 |
| 2008/0178925 A1 | 7/2008 | Wu et al. |
| 2009/0102502 A1* | 4/2009 | Frei et al. .................. 324/765 |

OTHER PUBLICATIONS

Compaan et al., "Optimization of Laser Scribing for Thin-Film PV Modules", Jun. 1998, NREL/SR-520-24842.*
Brecl et al article, "A Detailed Study of Monolithic Contacts and Electrical Losses in a Large-Area Thin-Film Module," Mar. 10, 2005, Progress in Photovaltaics; Research and Applications, 2005, vol. 13, pp. 297-310.
Compaan et al article, "Optimization of Laser Scribing for Thin-Film PV Modules," Jun. 1998, Final Technical Progress Report (Dec. 4, 1995-Nov. 10, 1997).
PCT International Search Report and Written Opinion dated May 6, 2010 for International Application No. PCT/US2009/056787.

* cited by examiner

*Primary Examiner*—Ha Tran T Nguyen
*Assistant Examiner*—Shantanu C Pathak
(74) *Attorney, Agent, or Firm*—Patterson & Sheridan, LLP

(57) ABSTRACT

A method and apparatus for improving a thin film scribing procedure is presented. Embodiments of the invention include a method and apparatus for determining a scribe setting for removal of an absorber layer of a photovoltaic device that improves contact resistance between a back contact layer and a front contact layer of the device.

20 Claims, 6 Drawing Sheets

US 7,829,356 B2

THIN FILM SCRIBE PROCESS

BACKGROUND OF THE INVENTION

1. Field of the Invention

Embodiments of the present invention generally relate to photovoltaic devices and fabrication processes thereof. In particular, embodiments of the present invention relate to apparatus and methods for the fabrication of thin-film photovoltaic devices.

2. Description of the Related Art

Photovoltaic (PV) devices are devices that convert sunlight into direct current (DC) electrical power. A PV device may be classified as monocrystalline, polycrystalline, or thin-film depending on how the device is fabricated.

Monocrystalline PV devices are produced by slicing wafers from a single crystal, high-purity, silicon boule. Polycrystalline PV devices are produced by sawing a cast block of silicon into bars, then wafers. Thin-film PV devices are produced by depositing thin layers of materials, such as amorphous silicon, microcrystalline silicon, or copper indium gallium selenide (CIGS) onto a suitable substrate.

Although monocrystalline and polycrystalline silicon have traditionally produced PV devices with higher efficiencies, the high cost of crystalline silicon wafers has led the industry into increased use and development of thin-film PV devices.

Accordingly, as the production of thin-film PV devices matures, the need for increased process control has developed. This need is driven by both yield and uniformity considerations. Additionally, fast and effective ramp-up of new or duplicated production lines is needed as well.

Therefore, a need exists for apparatus and methods for optimizing processes for the fabrication of thin-film photovoltaic devices.

SUMMARY OF THE INVENTION

In one embodiment of the present invention, a method for improving thin film scribe parameters comprises preparing a control sample having first and second back contact pads formed over a front contact layer, preparing first and second test samples having an absorber layer deposited over a front contact layer, removing the absorber layer of the first test sample at a first scribe setting, removing the absorber layer of the second test sample at a second scribe setting, depositing first and second back contact pads on each of the first and second test samples, determining the contact resistance of each of the control sample, the first test sample, and the second test sample, comparing the contact resistance of each of the first and second test samples to the contact resistance of the third test sample, and determining the preferred scribe setting between the first scribe setting and the second scribe setting.

In another embodiment of the present invention, a method for improving scribe parameters for the production of thin film photovoltaic devices comprises depositing a front contact layer on a large area substrate comprising a control section and a plurality of test sections, depositing an absorber layer over the front contact layer of each of the test sections, removing the absorber layer from each of the test sections, wherein a different scribe setting is used for removing the absorber layer from each individual test section, depositing a plurality of back contact pads onto the control section, depositing a plurality of back contact pads onto each of the test sections, determining the contact resistance between the back contact pads and the front contact layer of the control section, determining the contact resistance between the back contact pads and the front contact layer of each of the test sections, comparing the determined contact resistance of each of the test sections to the control section, and determining the preferred scribe setting.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
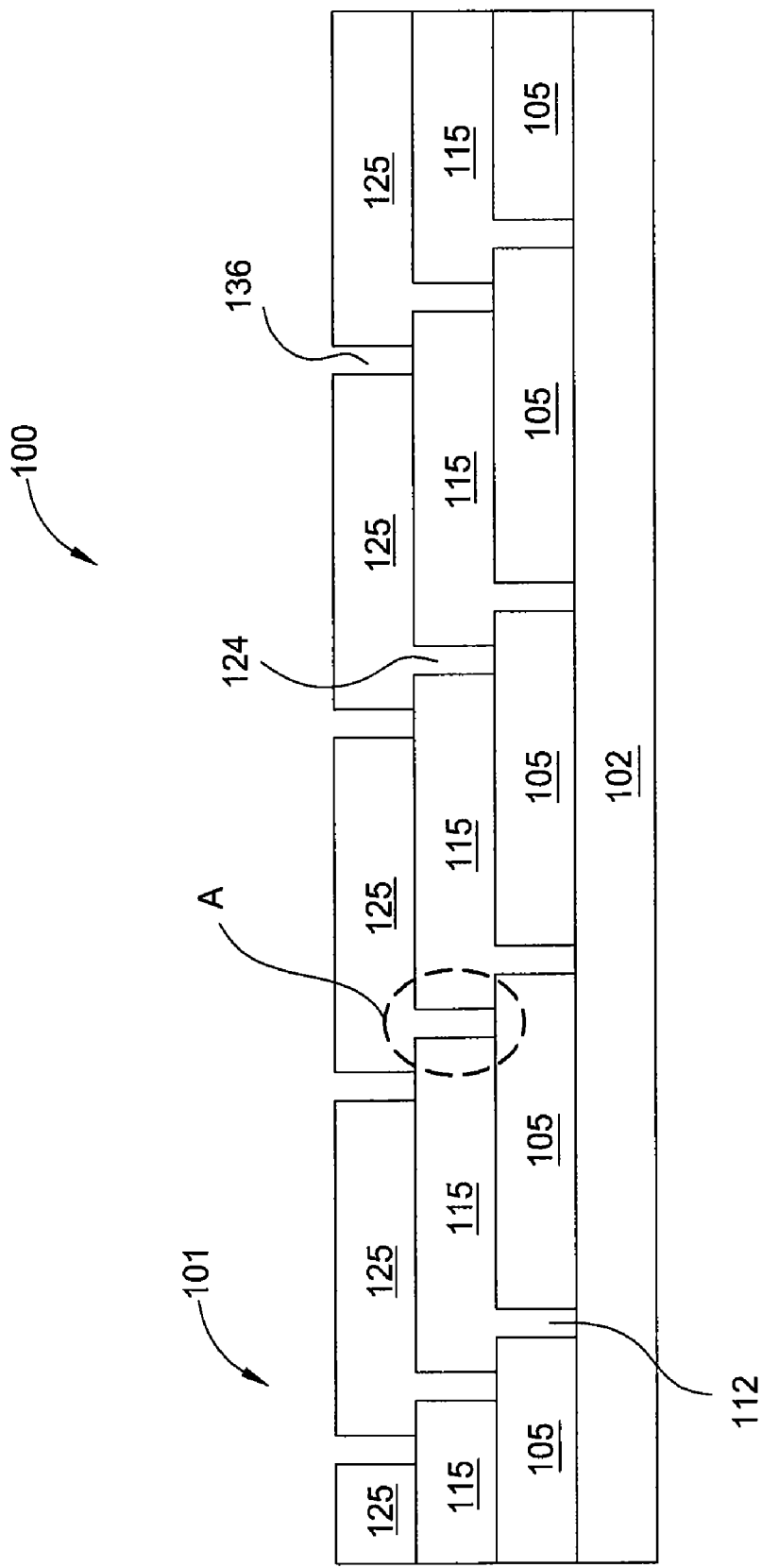
FIG. 1 is a schematic cross-section of a thin-film PV module showing series connections between individual cells.

In thin-film PV module fabrication, individual PV cells may be formed and interconnected into a module via scribing the layers of the cell. Scribing the layers of a solar cell may be performed by laser ablation, water-jet cutting, wheel grinding, or other similar methods. FIG. 1 is a schematic cross-section of a thin-film PV module 100 showing series connections between individual cells 101. PV module 100 comprises a substrate 102, such as a glass or polymer substrate, with thin films formed thereover.

In the PV module 100 fabrication process, a front contact layer 105, which may be a transparent conducting oxide (TCO) layer, may be formed over the substrate 102. The front contact layer 105 may comprise tin oxide, zinc oxide, indium tin oxide, cadmium stannate, combinations thereof, or other suitable materials. In a first scribing step, a first insulating groove 112 may be created in the front contact layer 105 to interrupt lateral current flow. An absorber layer 115 may then be formed over the front contact layer 105. The absorber layer 115 may comprise layers of thin films, including but not limited to, amorphous silicon, microcrystalline silicon, copper indium gallium selenide (CIGS), or combinations thereof. Next, a second scribing may create a groove 124 in the absorber layer 115, which may be filled during the subsequent step of forming a back contact layer 125 over the absorber layer 115. This results in an interconnection between the front contact layer 105 and the back contact layer 125. The back contact layer 125 may comprise a conductive layer and/or reflective coating. The conductive layer may be an aluminum doped zinc oxide (AZO) layer. The reflective coating may comprise metallic materials including, but not limited to Al, Ag, Ti, Cr, Au, Cu, Pt, alloys thereof, combinations thereof as well as other conductive and reflective materials. Finally a second insulating groove 136 may be formed in the back contact layer 125 to interrupt lateral current flow in the back contact layer 125.

As a result, each individual PV cell 101 of the module 100 is electrically connected in series with each adjacent cell 101. FIG. 1 depicts five PV cells 101 connected in series via the aforementioned scribing process. However, any number of PV cells 101 may be linked in this manner to form the PV module 100.

In the production of thin-film PV modules, such as the module 100, one critical parameter that dictates the ultimate efficiency of the module 100 is the contact resistance between the front contact layer 105 and the back contact layer 125. The contact resistance between the front contact layer 105 and the back contact layer 125 is, in turn, dependent upon optimum scribing of the absorber layer 115.

Figure 2:
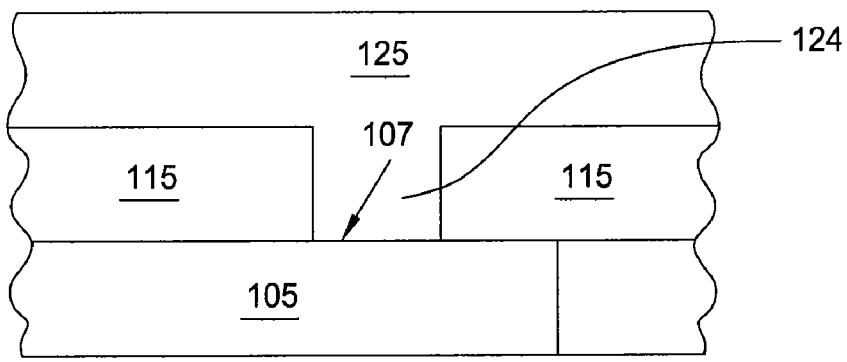
FIG. 2 is an enlarged, schematic view of section A of the module in FIG. 1.

FIG. 2 is an enlarged, schematic view of section A of the module 100 in FIG. 1. As previously described, the absorber layer 115 is scribed, and the back contact layer 125 is deposited thereover, filling the groove 124, and creating an electrical pathway between the front contact layer 105 and the back contact layer 125 at a front contact surface 107.

If the groove 124 is laser scribed at a laser power setting that is too high, the surface of the front contact layer 105 overheats resulting in an alteration in the contact surface 107. Similarly if the groove 124 is scribed at a water-jet or a grinding wheel power setting that is too high, the surface of the front contact layer 105 is altered as well. This alteration produces an undesirable change in morphology, which results in poor conductive contact between the front contact layer 105 and the later deposited back contact layer 125. The result is higher contact resistance between the front contact layer 105 and the back contact layer 125 than may be achieved with scribing of the absorber layer with an improved power setting.

If, however, the groove 124 is scribed at a power setting that is too low, the absorber layer 115 is not completely removed, resulting in a plurality of absorber layer particles remaining on the front contact surface 107. The absorber layer particles on the front contact surface 107 prevent full conductive contact between the front contact layer 105 and the later deposited back contact layer 125. The result, again, is higher contact resistance between the front contact layer 105 and the back contact layer 125 than may be achieved with laser scribing of the absorber layer 115 with an improved power setting.

At an improved power setting, the groove 124 is scribed such that the absorber layer 115 is completely removed, yet the contact surface 107 is not altered from its as deposited state. The result of scribing at the improved power setting is full conductive contact between the front contact layer 105 and the back contact layer 125. When such contact is achieved, the contact resistance between the front contact layer 105 and the back contact layer 125 is minimized, and the efficiency of the PV module 100 is maximized.

Figure 3:
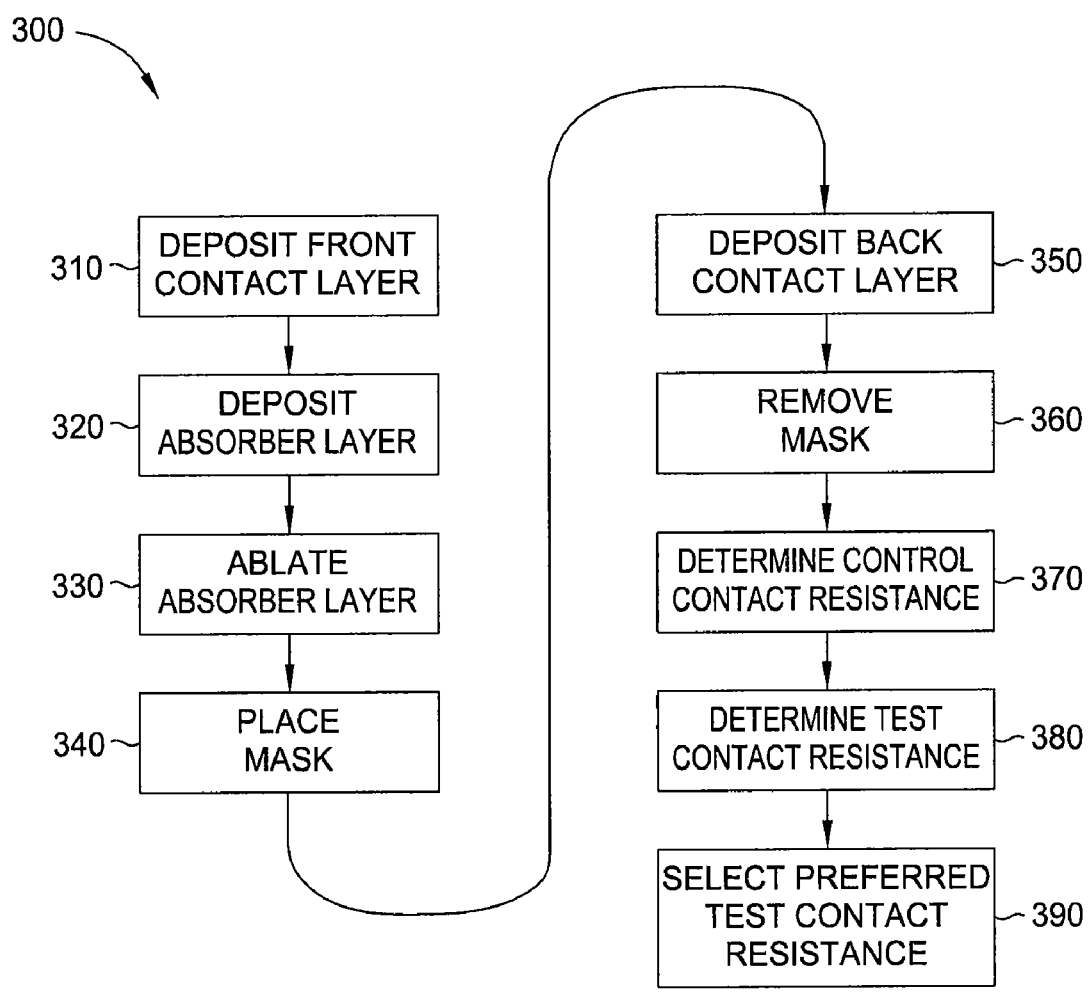
FIG. 3 is a schematic block chart depicting a method for determining an improved device setting for scribing a groove in an absorber layer of a thin-film solar module according to one embodiment of the present invention.

FIG. 3 is a schematic block chart depicting a method 300 for determining an improved setting for scribing a groove in an absorber layer of a thin-film solar module according to one embodiment of the present invention. FIGS. 4A-4F are schematic, cross-sectional views of a control panel 400 and one of a plurality of test panels 500, and FIGS. 5A-5F are corresponding schematic, top views of the control panel 400 and one of the plurality of test panels 500 illustrating a progression of steps according to the method 300 depicted in FIG. 3.

Figure 4A:
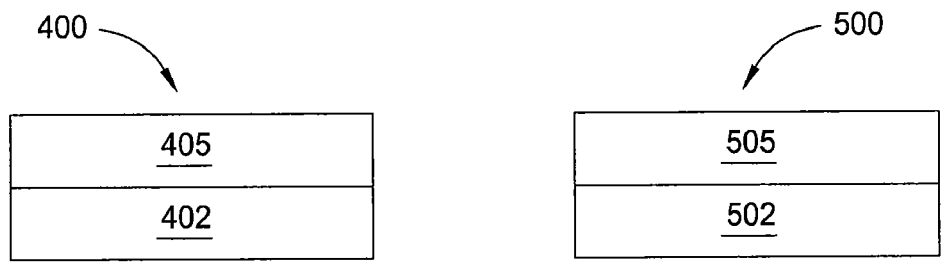
FIGS. 4A-4F are schematic, cross-sectional views of a control panel and one of a plurality of test panels illustrating a progression of steps according to the method depicted in FIG. 3.
Figure 5A:
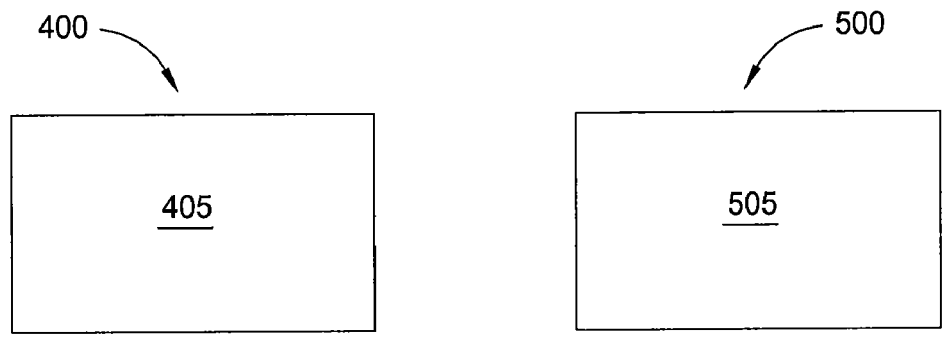
FIGS. 5A-5F are schematic, top views of the control panel and one of the plurality of test panels illustrating a progression of steps according to the method depicted in FIG. 3.

In one embodiment, at step 310 of FIG. 3 and depicted in FIGS. 4A, and 5A, a front contact layer 405 is deposited onto a substrate 402 of the control panel 400. An identical front contact layer 505 is deposited onto a substrate 502 of each of the test panels 500. Although, according to one embodiment, a plurality of test panels 500 is used in the method 300, the FIGS. 4A-4F and 5A-5F depict a single test panel 500. In one embodiment, the control panel 400 and the test panels 500 are separately constructed from a plurality of individual, sample-sized substrate panels, such as about 10 cm by about 7 cm rectangular substrates for instance. In another embodiment, the control panel 400 and the plurality of test panels 500 are formed on a single large substrate panel, such as a rectangular substrate having a width of about 2.6 m and a length of about 2.2 m.

Figure 4B:
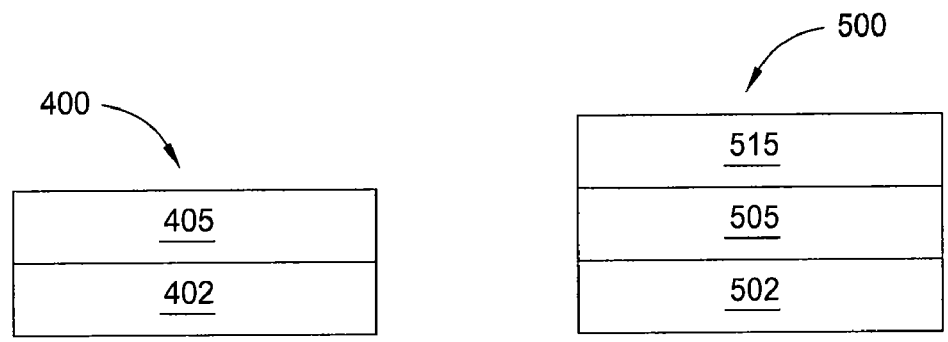
Figure 5B:
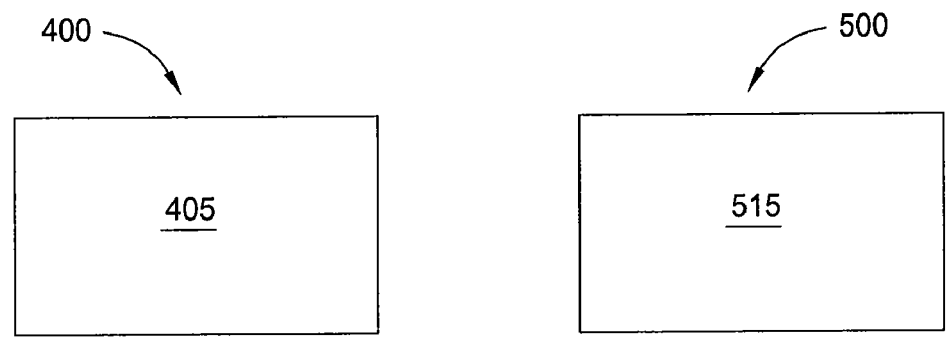
Figure 4C:
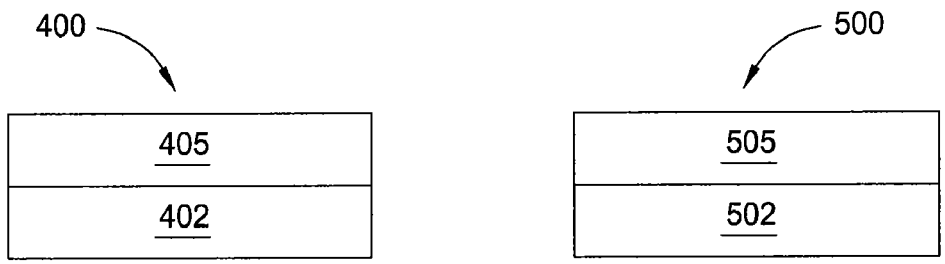
Figure 5C:
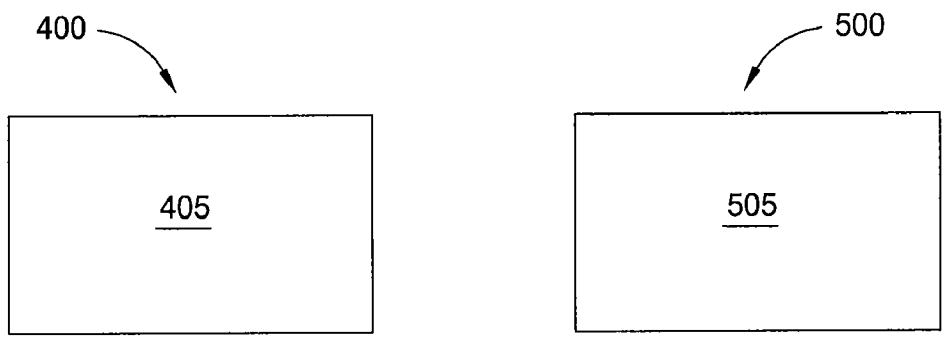

At step 320, as shown in FIGS. 3, 4B, and 5B, an absorber layer 515 is deposited onto the front contact layer 505 of each of the test panels 500. At step 330 of FIG. 3 and as depicted in FIGS. 4C and 5C, the entire surface of the absorber layer 515 is removed in a scribing operation, such as that used to form groove 124 in FIGS. 1 and 2. In one embodiment, the entire surface of each individual test panel 500 is removed using a constant scribe setting. However, the scribe settings are varied from one test panel 500 to the next test panel 500. For instance, for a first test panel 500 the entire surface of the absorber layer 515 is removed using a first scribe power setting, and the surface of the absorber layer 515 of each successive test panel 500 is removed using a succession of increasing and/or decreasing scribe power settings. Therefore, the surface of the absorber layer 515 of each test panel 500 is removed with a different scribe power setting. Although the power setting is varied in the above-described embodiment, a number of other parameters of the scribing device may be varied instead. In one embodiment, laser power, current, or frequency may be altered. In another embodiment, water-jet power, pressure, or flow may be altered. In yet another embodiment, grinding wheel power, pressure, force, or speed may be altered.

Figure 4D:
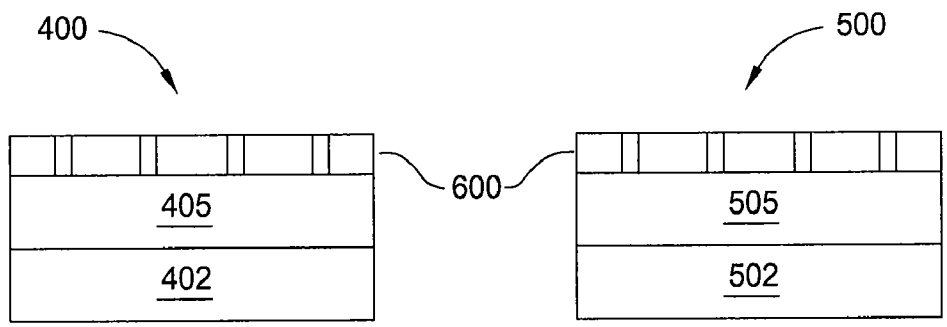
Figure 5D:
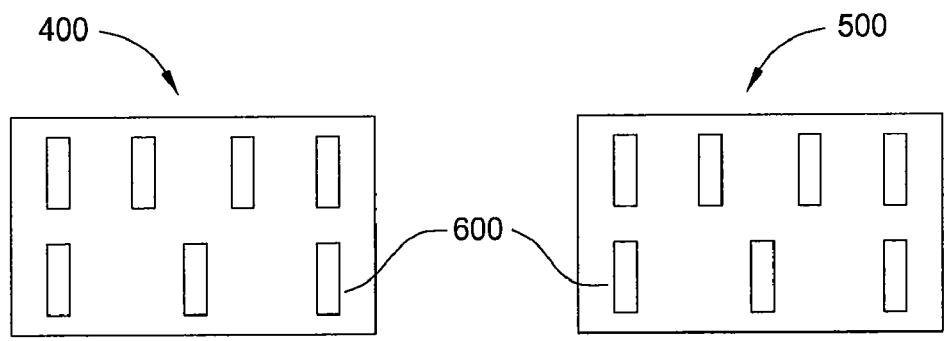
Figure 6:
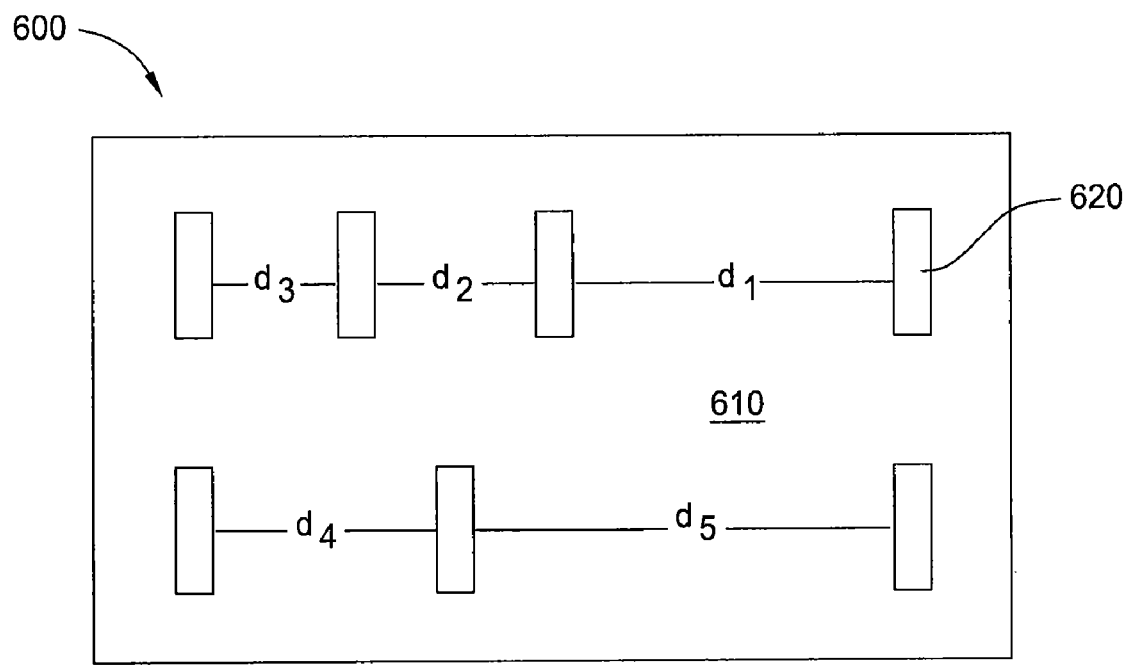
FIG. 6 is a top view of a mask for depositing back contact pads onto the control panel and each of the plurality of test panels according to one embodiment of the present invention.

At step 340 of FIG. 3, a mask 600 is placed onto the control panel 400 and each of the test panels 500 as shown in FIGS. 4D and 5D, respectively. FIG. 6 is a top view of the mask 600 according to one embodiment of the present invention. In one embodiment, the mask body 610 is a rectangular sheet member approximately the size of the individual panels 400, 500. In one embodiment mask 600 is comprised of a metal, such as stainless steel or aluminum. In one embodiment, the mask 600 is comprised of a non-metallic material, such as a ceramic or polymeric material. The mask 600 has a plurality of apertures 620 formed therethrough. In one embodiment, the apertures 620 are formed with varying distances (d1-d5) between each successive aperture as depicted in FIG. 6. Although the mask 600 depicted in FIG. 6 has seven apertures 620 formed therethrough, any number of apertures 620 may be utilized as long as the mask 600 has at least two apertures 620 and a distance (d1) therebetween. In one embodiment, the apertures 620 are rectangular in shape. However, the shape of the aperture 620 is not limited and may be of any shape.

Figure 4E:
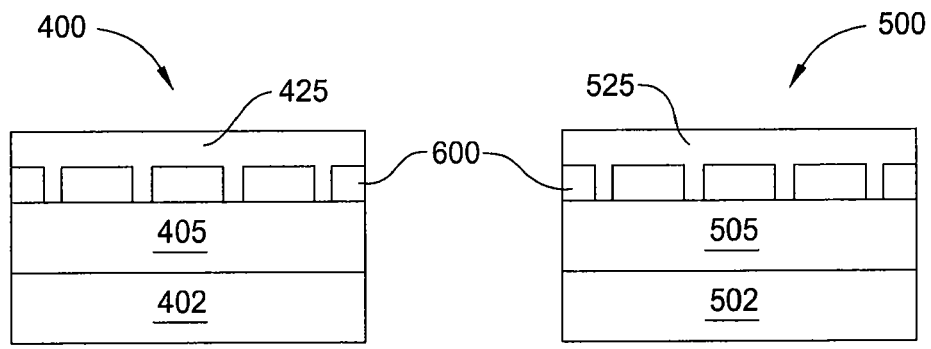
Figure 5E:
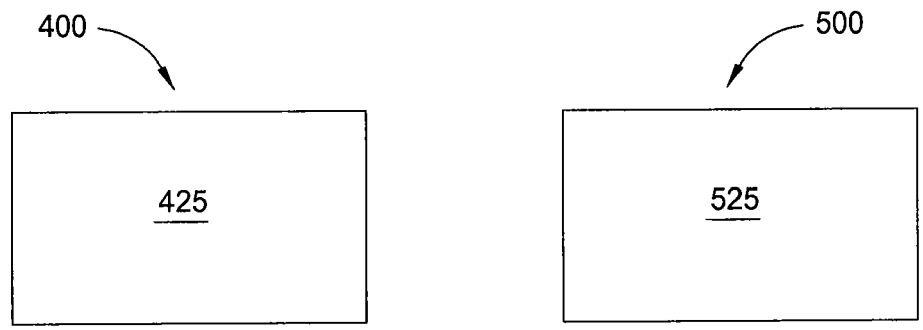

At step 350 of FIG. 3 and as shown in FIGS. 4E and 5E, a back contact layer 425, 525 is deposited over the mask 600 located on the control panel 400 and each of the test panels 500 such that the back contact layer 425, 525 only contacts the front contact layer 405, 505 at the locations of the apertures 620 of the mask 600.

Figure 4F:
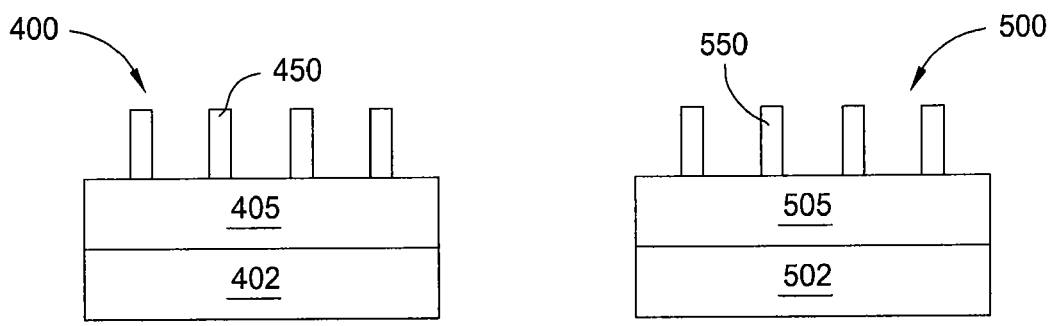
Figure 5F:
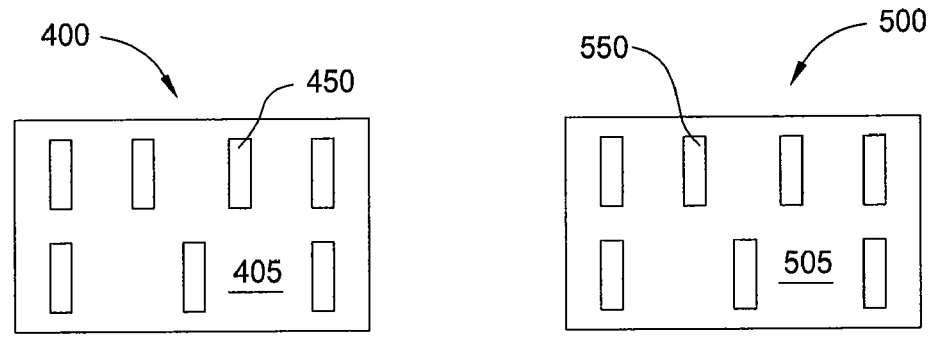

At step 360 of FIG. 3, the mask 600 is removed from the control panel 400 and each of the test panels 500. As a result, the only portions of the back contact layer 425, 525 remaining on the control panel 400 and each of the test panels 500 are pads 450, 550, separated by distances (d1-d5), as shown in FIGS. 4F and 5F.

At step 370 of FIG. 3, the resistance between the various pads 450 of the control panel 400 is measured by one of a variety of methods known in the art, and a baseline contact resistance between the back contact layer 425 and the front contact layer 405 is determined as subsequently described. Since the control panel 400 never had an absorber layer deposited on the front contact layer 405, the determined baseline contact resistance represents the minimum contact resistance achievable between the back contact layer 425 and the front contact layer 405.

At step 380, the resistance between the various pads 550 of each of the test panels 500 is measured, and a contact resistance between the back contact layer 525 and the front contact layer 505 is determined for each of the plurality of test panels 500 as subsequently described. Since the absorber layer 515 previously deposited onto each of the test panels 500 was removed using different scribe parameters for each test panel 500, it follows that each test panel 500 has a different amount of either over-scribing of the absorber layer 515, resulting in various amounts of altered morphology of the surface of the front contact layer 505, or under-scribing of the absorber layer 515, resulting in various amounts of absorber layer 515 particles remaining on the surface of the front contact layer 505. Therefore, each test panel 500 will have a different determined contact resistance, which corresponds to the scribe parameters that were varied during the removal process.

At step 390, the contact resistance determined for each of the test panels 500 are compared to the baseline contact resistance determined for the control panel 400. In one embodiment, the scribe parameters used on the test panel 500 having a contact resistance that most closely matches the contact resistance of the control panel 400 are selected as the scribe settings for production. In one embodiment, steps 310-390 may be repeated with refined scribe settings to more closely match that of the baseline contact resistance established for the control panel 400.

Figure 7:
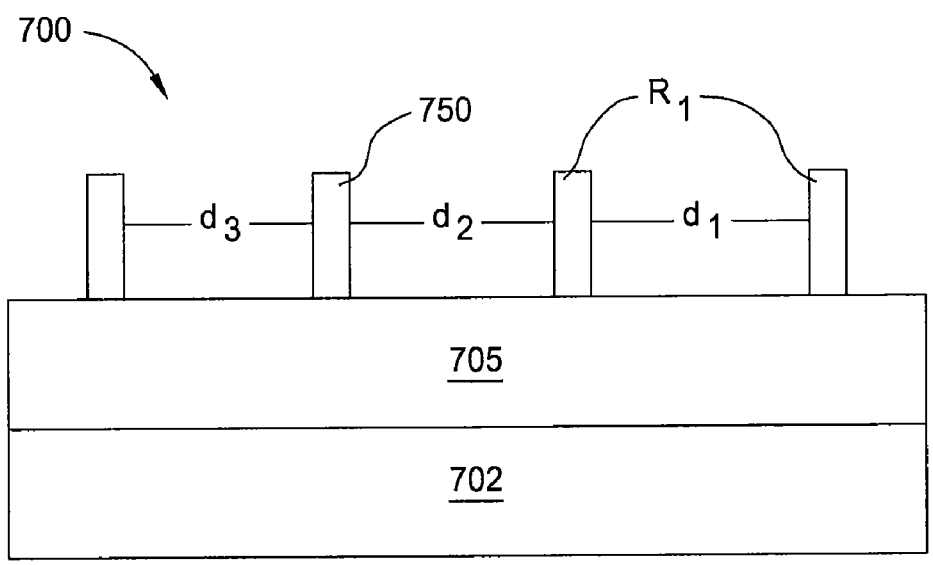
FIG. 7 is a schematic, cross-sectional view of a panel, which may be either a control panel or one of the test panels in FIGS. 4A-4F and 5A-5F.

The contact resistance for each panel 400, 500 may be determined as follows. FIG. 7 is a schematic, cross-sectional view of a panel 700, which may be either a control panel 400 or one of the test panels 500 in FIGS. 4A-4F and 5A-5F. The panel 700 comprises a substrate 702 with a front contact layer 705 deposited thereover. Back contact layer pads 750 are deposited over the front contact layer 705 using the mask 600 described with respect to FIG. 6.

As shown in FIG. 7, the pads 750 are deposited onto the front contact layer 705 having varying distances (d1-d3) therebetween. The resistance (R1) between two successive pads is measured. The contact resistance (Rc) may then be determined according to the following equation:

$$R1 = 2(Rc) + d1(Rs)$$

where Rs=sheet resistance of the front contact layer.

As previously stated, once the contact resistance for each of the test panels 500 is determined, it is then compared with the contact resistance of the control panel 400. The scribe parameters used for the removal of the absorber layer 515 from the test panel 500 having a contact resistance most closely matching the contact resistance of the control panel 400 may then be selected for the improved scribing parameters used in production.

While the foregoing is directed to embodiments of the present invention, other and further embodiments of the invention may be devised without departing from the basic scope thereof, and the scope thereof is determined by the claims that follow.

The invention claimed is:

1. A method for improving thin film scribe parameters, comprising:
    preparing a control sample having first and second back contact pads formed over a front contact layer, wherein no material is deposited onto the front contact layer prior to forming the first and second back contact pads;
    preparing first and second test samples having an absorber layer deposited over a front contact layer;
    removing a surface of the absorber layer of the first test sample at a first scribe setting;
    removing a surface of the absorber layer of the second test sample at a second scribe setting;
    depositing first and second back contact pads on each of the first and second test samples;
    determining the contact resistance of each of the control sample, the first test sample, and the second test sample;
    comparing the contact resistance of each of the first and second test samples to the contact resistance of the control sample; and
    determining the preferred scribe setting between the first scribe setting and the second scribe setting.

2. The method of claim 1, wherein the preparing the control sample comprises depositing a front contact layer over a substrate and depositing the first and second back contact pads over the front contact layer of the control sample.

3. The method of claim 2, wherein depositing the first and second back contact pads over the front contact layer of the control sample comprises placing a mask over the front contact layer of the control sample, depositing a back contact layer over the control sample, and removing the mask.

4. The method of claim 1, wherein preparing the first and second test samples comprises depositing a front contact layer over a substrate and depositing an absorber layer over the front contact layer.

5. The method of claim 1, wherein depositing the first and second back contact pads on each of the first and second test samples comprises placing a mask over each of the first and second test samples, depositing a back contact layer over the mask, and removing the mask.

6. The method of claim 5, wherein the mask has a plurality of apertures formed therethrough.

7. The method of claim 1, wherein determining the contact resistance comprises measuring the resistance between each of the first and second back contact pads and calculating the contact resistance.

8. The method of claim 1, wherein determining the preferred scribe setting comprises determining the test sample with a contact resistance closest to the contact resistance of the control sample and selecting the scribe setting used to remove the surface of the absorber layer for the determined test sample.

9. The method of claim 8, wherein removing the surface of the absorber layers from the first and second test samples comprises laser ablation.

10. A method for improving scribe parameters for the production of thin film photovoltaic devices, comprising:
    depositing a front contact layer on a large area substrate comprising a control section and a plurality of test sections;
    depositing an absorber layer over the front contact layer of each of the test sections;

removing a surface of the absorber layer on each of the test sections, wherein a different scribe setting is used for removing the surface of the absorber layer from each individual test section;

depositing a plurality of back contact pads onto the control section, wherein no material is deposited onto the front contact layer of the control section prior to depositing the plurality of back contact pads;

depositing a plurality of back contact pads onto each of the test sections;

determining the contact resistance between the back contact pads and the front contact layer of the control section;

determining the contact resistance between the back contact pads and the front contact layer of each of the test sections;

comparing the determined contact resistance of each of the test sections to the control section; and determining the preferred scribe setting.

11. The method of claim 10, wherein the front contact layer is a transparent conducting oxide layer.

12. The method of claim 11, wherein the absorber layer is selected from the list consisting of amorphous silicon, microcrystalline silicon, and copper indium gallium selenide.

13. The method of claim 12, wherein the large area substrate is a rectangular glass or polymer substrate having a width of about 2.6 m and a length of about 2.2 m.

14. The method of claim 13, wherein the control section and each of the plurality of test sections are rectangular sections of the large area substrate having a width of about 10 cm and a length of about 7 cm.

15. The method of claim 10, wherein the scribe settings are selected from the list consisting of power, current, frequency, pressure, force, flow, and speed.

16. A method for improving scribe parameters for the production of thin film photovoltaic devices, comprising:

depositing a front contact layer on a large area substrate comprising a control section and a plurality of test sections;

depositing an absorber layer over the front contact layer of each of the test sections;

removing a surface of the absorber layer on each of the test sections, wherein a different scribe setting is used for removing the surface of the absorber layer from each individual test section;

depositing a plurality of back contact pads onto the control section, wherein the depositing a plurality of back contact pads onto the control section comprises placing a mask over the front contact layer of the control section of the large area substrate, depositing a back contact layer over the mask, and removing the mask, wherein the mask has a plurality of apertures configured therethrough;

depositing a plurality of back contact pads onto each of the test sections;

determining the contact resistance between the back contact pads and the front contact layer of the control section;

determining the contact resistance between the back contact pads and the front contact layer of teach of the test sections;

comparing the determined contact resistance of each of the test sections to the control section; and determining the preferred scribe setting.

17. The method of claim 16, wherein the depositing a plurality of back contact pads onto each of the test sections comprises placing a mask over each of the plurality of test sections, depositing a back contact layer over the mask, and removing the mask, wherein the mask has a plurality of apertures configured therethrough.

18. The method of claim 17, wherein determining the contact resistance between the back contact pads and the front contact layer of the control section comprises measuring the resistance between at least a first and second back contact pads and calculating the contact resistance.

19. The method of claim 18, wherein determining the contact resistance between the back contact pads and the front contact layer of each of the test sections comprises measuring the resistance between at least a first and second back contact pads of each of the test sections and calculating the contact resistance.

20. The method of claim 19, wherein determining the preferred scribe setting comprises determining the test section having a contact resistance closest to the contact resistance of the control section and selecting the scribe setting used to remove the absorber layer for the determined test section.

* * * * *